(12) United States Patent
Hong et al.

(10) Patent No.: US 7,977,707 B2
(45) Date of Patent: Jul. 12, 2011

(54) CAPACITORLESS DRAM HAVING A HOLE RESERVING UNIT

(75) Inventors: Ki-ha Hong, Seoul (KR); Jae-woong Hyun, Uljeongbu-si (KR); Young-gu Jin, Hwaseong-si (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 12/005,399

(22) Filed: Dec. 27, 2007

(65) Prior Publication Data

US 2008/0303063 A1    Dec. 11, 2008

(30) Foreign Application Priority Data

Jun. 5, 2007   (KR) .................. 10-2007-0055248

(51) Int. Cl.
   *H01L 33/00*   (2010.01)

(52) U.S. Cl. .......... 257/192; 257/E27.084; 257/E27.085
(58) Field of Classification Search .................. 257/192, 257/E27.084, E27.085
See application file for complete search history.

(56) References Cited

U.S. PATENT DOCUMENTS

| | | | |
|---|---|---|---|
| 6,487,112 B1 * | 11/2002 | Wasshuber | 365/163 |
| 6,633,066 B1 * | 10/2003 | Bae et al. | 257/347 |
| 6,969,662 B2 * | 11/2005 | Fazan et al. | 438/292 |
| 7,602,001 B2 * | 10/2009 | Gonzalez | 257/296 |

* cited by examiner

*Primary Examiner* — Howard Weiss
(74) *Attorney, Agent, or Firm* — Harness, Dickey & Pierce, P.L.C.

(57) ABSTRACT

Provided are a capacitorless DRAM and methods of manufacturing the same. The capacitorless DRAM may include a substrate including a source, a drain and a channel, a gate on the channel of the substrate, and a hole reserving unit below the channel.

22 Claims, 15 Drawing Sheets

CAPACITORLESS DRAM HAVING A HOLE RESERVING UNIT

PRIORITY STATEMENT

This application claims priority under 35 U.S.C. §119 to Korean Patent Application No. 10-2007-0055248, filed on Jun. 5, 2007, in the Korean Intellectual Property Office (KIPO), the entire contents of which are incorporated herein by reference.

BACKGROUND

1. Field

Example embodiments relate to a semiconductor device and methods of manufacturing the same. Other example embodiments relate to a capacitorless DRAM and methods of manufacturing the same.

2. Description of the Related Art

A memory cell of a conventional dynamic random access memory (DRAM) has a 1T/1C structure in which one transistor and one capacitor are included. Because the conventional DRAM includes a transistor and a capacitor, reducing the cell area of the conventional DRAM to a size of about $4F^2$ (F: feature size) or less may be difficult. In respect to reducing the size of DRAM devices, a DRAM that may store data using only the transistor without the capacitor, e.g., a capacitorless 1T DRAM, has been proposed. The capacitorless 1T DRAM may have an electrically floated channel body.

FIGS. 1A and 1B are cross-sectional views of a conventional capacitorless DRAM and a method of operating the conventional capacitorless DRAM. Referring to FIGS. 1A and 1B, a gate 110 may be formed on a silicon on insulator (SOI) substrate 100. The SOI substrate 100 may have a structure in which a first silicon layer 10, an oxide layer 20, and a second silicon layer 30 are sequentially stacked, and the gate 110 may have a structure in which a gate insulating layer 40 and a gate conductive layer 50 are sequentially stacked. A source 30a and a drain 30b may be formed in the second silicon layer 30 on either side of the gate 110. A floating channel body 30c, that is electrically separated from the first silicon layer 10, may be formed between the source 30a and the drain 30b. The floating channel body 30c may be a partially depleted region having a thickness of about 150 nm.

As illustrated in FIG. 1A, when voltages of 0.6V, 0V, and 2.3V are respectively applied to the gate conductive layer 50, the source 30a, and the drain 30b, electrons migrate from the source 30a to the drain 30b through the floating channel body 30c. In this process, electron-hole pairs are generated by electron impact in the floating channel body 30c. The holes may not leave the floating channel body 30c but accumulate in the floating channel body 30c. The holes may be called excess holes 5. A state when the excess holes 5 accumulate in the floating channel body 30c is a first state.

As illustrated in FIG. 1B, when voltages of 0.6V, 0V, and −2.3V are respectively applied to the gate conductive layer 50, the source 30a, and the drain 30b, a forward bias may be applied between the floating channel body 30c and the drain 30b. The excess holes 5 of FIG. 1A may be removed from the floating channel body 30c, and electrons 7 may accumulate in the floating channel body 30c. A state when the electrons 7 accumulate in the floating channel body 30c is a second state. Because the floating channel body 30c has different resistances in the first and second states, the first and second states may be used to represent different data states, e.g., '1' and '0'.

However, in the conventional capacitorless DRAM, the floating channel body 30c may have undesirable data retention properties. In the conventional capacitorless DRAM, a relatively wide area of the floating channel body 30c may contact the source 30a and the drain 30b. Thus, a relatively large amount of charges may be lost at the corresponding junctions. Accordingly, data retention time in the floating channel body 30c may be reduced.

SUMMARY

Example embodiments provide a capacitorless DRAM having improved data retention properties. Example embodiments also provide methods of manufacturing the capacitorless DRAM.

According to example embodiments, a capacitorless DRAM may include a substrate including a source, a drain, and a channel, a gate on the channel of the substrate, and a hole reserving unit disposed below the channel.

The substrate may include an insulating layer, and a semiconductor layer on the insulating layer, wherein the semiconductor layer includes the source, the drain, and the channel. The hole reserving unit may include another semiconductor layer, and a hole reservoir existing in the other semiconductor layer. The other semiconductor layer may be a p-type semiconductor layer. A valence band of the hole reservoir may be higher than a valence band of the semiconductor layer. A valence band of the hole reservoir may be higher than a valence band of the other semiconductor layer.

The hole reserving unit may be formed in a lower portion of the semiconductor layer that is between the source and the drain, and the hole reserving unit may include a hole reservoir separated from the source and the drain. A valence band of the hole reservoir may be higher than a valence band of the semiconductor layer. The hole reservoir may be separated from the source and the drain. The hole reservoir may include at least one of a semiconductor material and a metal material. The semiconductor layer may be a Si layer, and the semiconductor material may include at least one of Ge, Si—Ge, Al—Sb and Ga—Sb.

The substrate may be a silicon on insulator (SOI) substrate. A region between the source and the drain of the semiconductor layer may be a fully depleted region or a partially depleted region. The hole reserving unit may include a semiconductor layer and a hole reservoir formed in the semiconductor layer. The hole reservoir may be formed to be a layer. The hole reservoir may include quantum dots.

According to example embodiments, a method of manufacturing a capacitorless DRAM may include preparing a substrate having a structure in which an insulating layer and a semiconductor layer are sequentially formed, forming two oxide regions in a lower portion of the semiconductor layer to contact the insulating layer and to be separated from each other, ion implanting an impurity into the semiconductor layer between the oxide regions to form a hole reservoir, forming a gate on a region of the semiconductor layer, corresponding to the hole reservoir, and forming a source and a drain in the semiconductor layer on either side of the gate, wherein the source and the drain are on the oxide regions.

The substrate may be a silicon on insulator (SOI) substrate. The hole reservoir may be buried in the semiconductor layer between the two oxide regions. A valence band of the hole reservoir may be higher than a valence band of the semiconductor layer. The impurity that is ion implanted into the semiconductor layer for forming the hole reservoir may be Ge. The method of manufacturing a capacitorless DRAM may further include ion implanting a p-type impurity into the semiconductor layer between the oxide regions, between forming the oxide regions and forming the hole reservoir.

The method of manufacturing a capacitorless DRAM may further include ion implanting a p-type impurity into the semiconductor layer between the oxide regions, between preparing the substrate and forming the oxide regions. The hole reservoir may be buried in the semiconductor layer into which the p-type impurity is ion implanted.

According to example embodiments, a method of manufacturing a capacitorless DRAM may include preparing a structure in which a first semiconductor layer, a hole reserving layer, and a second semiconductor layer are sequentially formed, forming a mask layer for forming a gate on the structure, etching the second semiconductor layer, the hole reserving layer, and a part of the first semiconductor layer to a thickness on both sides of the mask layer, removing the mask layer, forming an insulating layer on the etched first semiconductor layer to cover the hole reserving layer and the second semiconductor layer, turning the resultant structure having the formed insulating layer upside down, forming a gate on a region of the first semiconductor layer, wherein the region corresponds to the hole reserving layer, and forming a source and a drain in the first semiconductor layer on either side of the gate.

A valence band of the hole reserving layer may be higher than a valence band of the first and second semiconductor layers. The first and second semiconductor layers may be Si layers. The hole reserving layer may be a semiconductor material layer or a metal material layer. The hole reserving layer may include any one of Ge, Si—Ge, Al—Sb, and Ga—Sb. The method of manufacturing a capacitorless DRAM may further include etching an upper surface of the first semiconductor layer to a predetermined or given thickness, between turning the resultant structure upside down and forming the gate.

According to example embodiments, a method of manufacturing a capacitorless DRAM may include preparing a substrate having a structure in which an insulating layer and a semiconductor layer are sequentially formed, forming a hole reservoir on a part of the semiconductor layer, forming another semiconductor layer on the semiconductor layer to cover the hole reservoir, forming a gate on the other semiconductor layer formed on the hole reservoir, and forming a source and a drain in the other semiconductor layer on either side of the gate.

The substrate may be a silicon on insulator (SOI) substrate. The method of manufacturing a capacitorless DRAM may further include etching the semiconductor layer to a thickness between preparing the substrate and forming the hole reservoir. The semiconductor layer and the other semiconductor layer may include the same material. A valence band of the hole reservoir may be higher than valence bands of the semiconductor layer and the other semiconductor layer. The hole reservoir may include at least one of a semiconductor material and a metal material. The semiconductor layer may be a Si layer, and the semiconductor material may include at least one of Ge, Si—Ge, Al—Sb and Ga—Sb.

The method of manufacturing a capacitorless DRAM may further include oxidizing a part of the semiconductor layer on both sides of the hole reservoir, between forming the other semiconductor layer and forming the gate. The method of manufacturing a capacitorless DRAM may further include oxidizing a lower portion of the other semiconductor layer, wherein the lower portion thereof contacts the oxidized region of the semiconductor layer. The hole reservoir may include a plurality of quantum dots. The method of manufacturing a capacitorless DRAM may further include ion implanting a p-type impurity into the area of the semiconductor layer on which the hole reservoir may be formed and into the area of the other semiconductor layer in which the hole reservoir may be formed, between oxidizing the part of the semiconductor layer and forming the gate. According to example embodiments, a capacitorless DRAM having improved data retention properties may be provided.

BRIEF DESCRIPTION OF THE DRAWINGS

Example embodiments will be more clearly understood from the following detailed description taken in conjunction with the accompanying drawings. FIGS. 2-10G represent non-limiting, example embodiments as described herein.

FIG. 2 is a cross-sectional view of a capacitorless DRAM according to example embodiments;

FIG. 3 is a graph showing an energy band of partial regions of regions distributed according to a line a-a' of FIG. 2;

FIGS. 4 and 5 are graphs showing a change in drain current (Id) with respect to gate voltage (Vg) according to time of a conventional capacitorless DRAM and a capacitorless DRAM according to example embodiments, respectively;

FIGS. 6 and 7 are cross-sectional views of a capacitorless DRAM according to example embodiments; and FIGS. 8A-10G are cross-sectional views showing methods of manufacturing a capacitorless DRAM according to example embodiments.

Figure 1A:
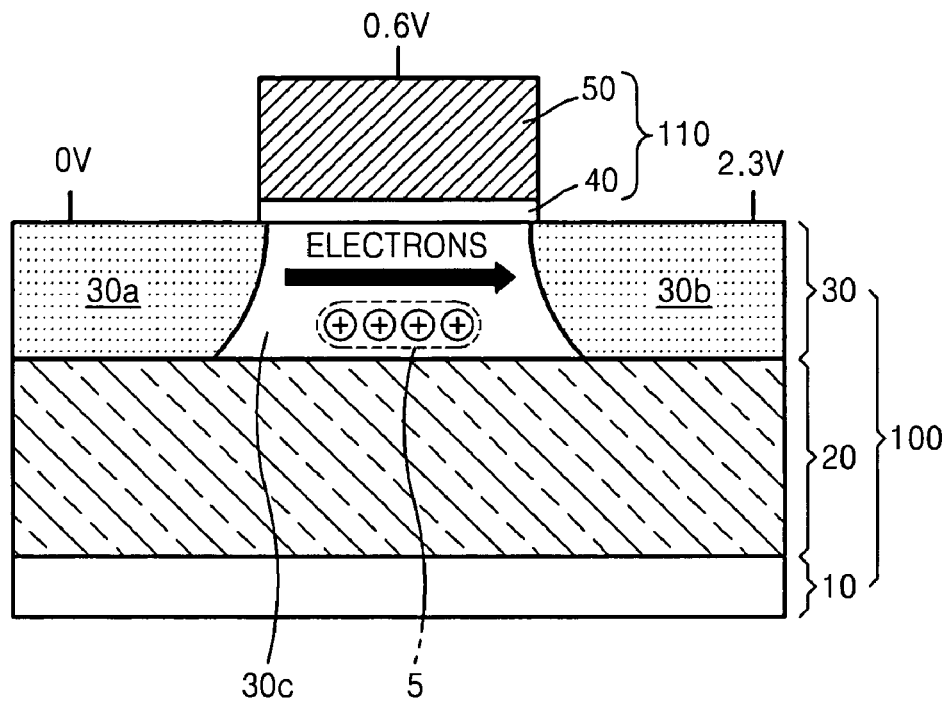
FIGS. 1A and 1B are cross-sectional views showing a structure of a conventional capacitorless DRAM and a method of operating the same.
Figure 1B:
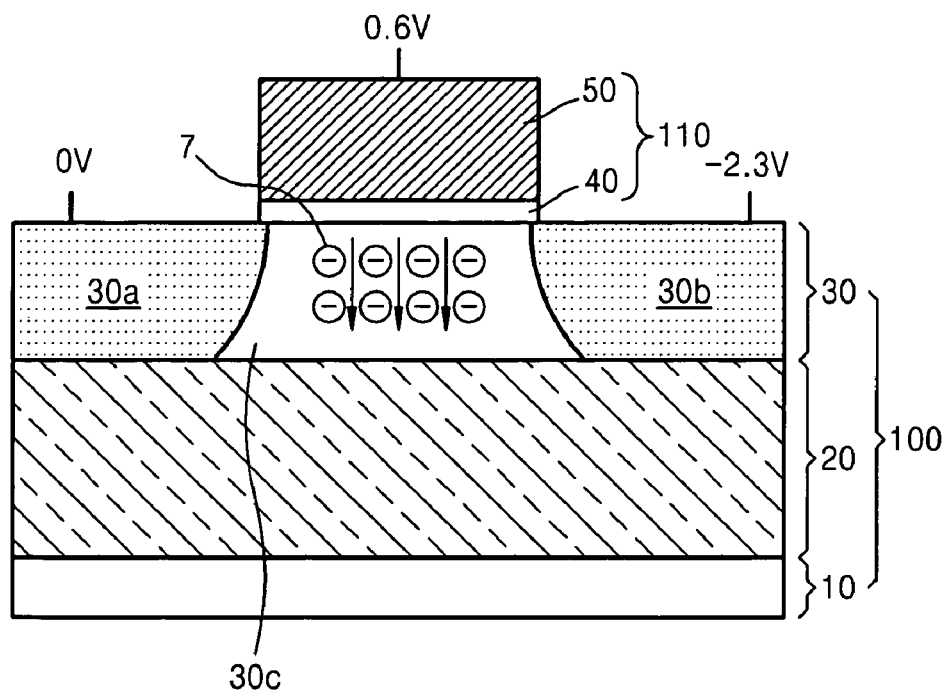

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A capacitorless dynamic random access memory (DRAM) according to example embodiments and methods of manufacturing the same will now be described more fully with reference to the accompanying drawings in which example embodiments are shown. In the drawings, the thicknesses of layers and regions are exaggerated for clarity, and like reference numerals refer to like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
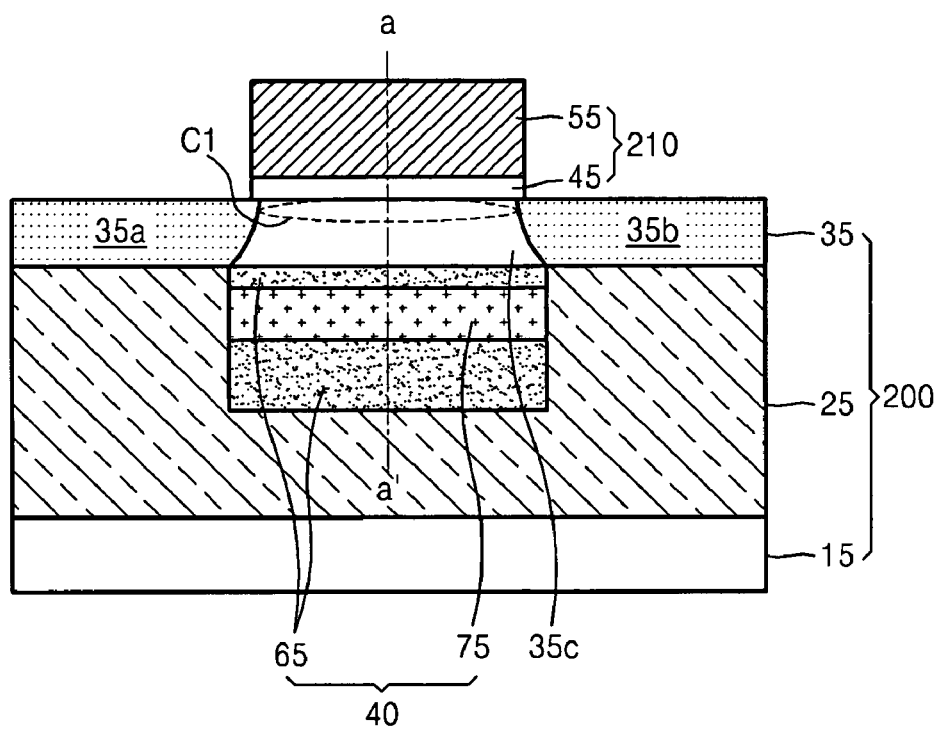

FIG. 2 is a cross-sectional view of a capacitorless DRAM according to example embodiments. Referring to FIG. 2, a substrate 200 may have a structure in which a first silicon layer 15, an oxide layer 25, and a second silicon layer 35 are sequentially stacked. A gate 210 may be formed on the substrate 200. The gate 210 may have a structure in which a gate insulating layer 45 and a gate conductive layer 55 are sequentially stacked. A source 35a and a drain 35b may be formed in the second silicon layer 35 on either side of the gate 210. A channel body 35c, which is electrically separated from the first silicon layer 15, may exist between the source 35a and the drain 35b. The channel body 35c may be a fully depleted region having a thickness of about 20 nm. An upper portion of the channel body 35c may be a channel region C1 where electrical polarity is reversed by the gate 210.

A hole reserving unit 40 may be formed below the channel region C1. The hole reserving unit 40 may be buried in the oxide layer 25. The hole reserving unit 40 may include another silicon layer 65 (hereinafter, referred to as a third silicon layer) formed in the oxide layer 25 which is formed on a lower surface of the channel body 35c, and a hole reservoir 75 which is formed in a central portion of the third silicon layer 65 and may divide the third silicon layer 65 into upper and lower layers. The hole reservoir 75 may be formed as a layer, may be buried in the third silicon layer 65, and may be separated from the source 35a and the drain 35b. The third silicon layer 65 may be a p-type silicon layer, e.g., a p+ silicon layer. The hole reservoir 75 may include a semiconductor material or a metal material which may have a higher valence band than that of Si. For example, the hole reservoir 75 may include any one of Ge, Si—Ge, Al—Sb, and Ga—Sb. Because the valence band of the hole reservoir 75 is higher than that of Si, holes may more easily be accumulated in the hole reservoir 75. The hole reservoir 75 may be separated from the source 35a and the drain 35b, and thus data retention properties may be improved by reducing the junction leakage current. Therefore, the capacitorless DRAM according to example embodiments may have improved data retention properties.

Figure 3:
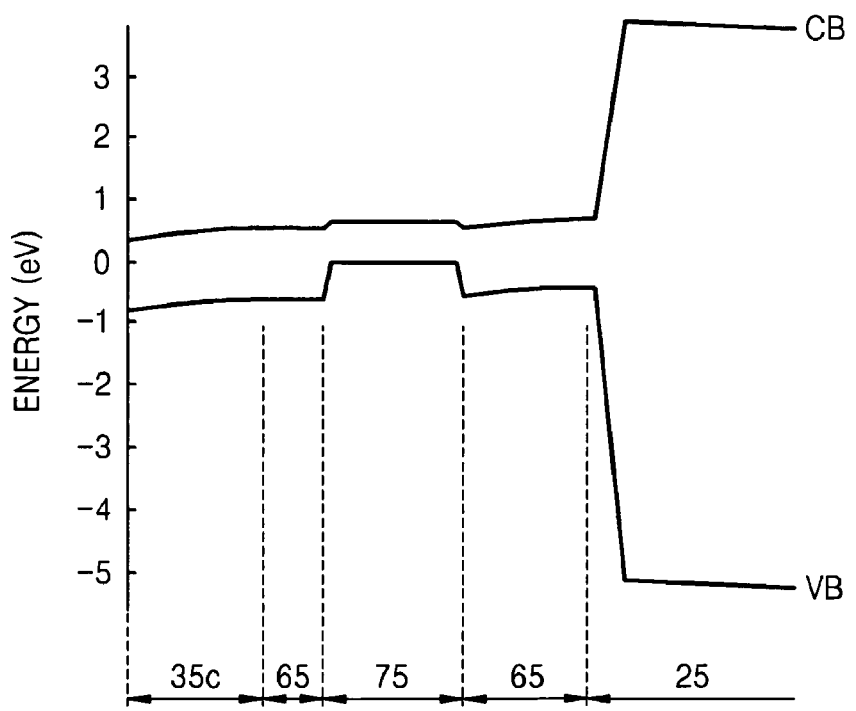

FIG. 3 is a graph showing an energy band of partial regions, for example, the channel body 35c, the third silicon layers 65, the hole reservoir 75 and the oxide layer 25, of regions distributed according to a line a-a' of FIG. 2. In FIG. 3, reference numerals CB and VB denote a conduction band and a valence band, respectively. Referring to FIG. 3, the VB of the hole reservoir 75 may be higher than the VB of the channel body 35c and the third silicon layers 65. The holes may be more easily accumulated in the hole reservoir 75 than in the channel body 35c and the third silicon layers 65.

Figure 4:
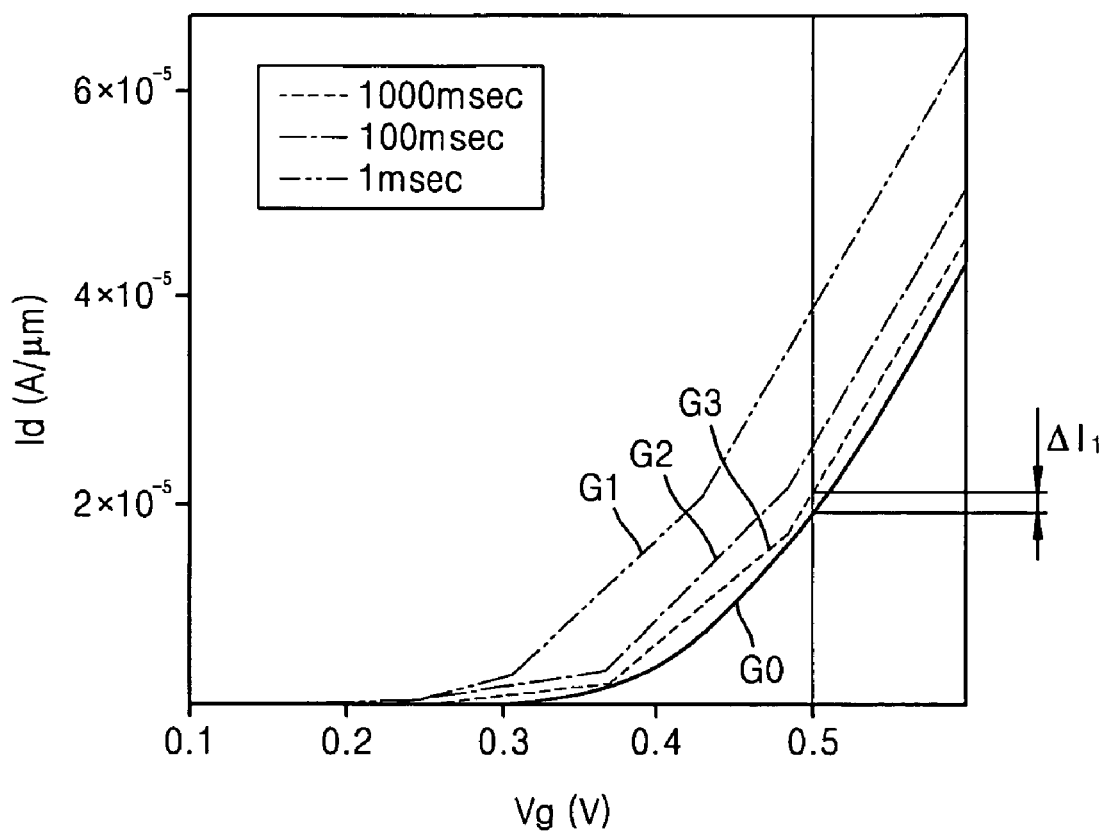
Figure 5:
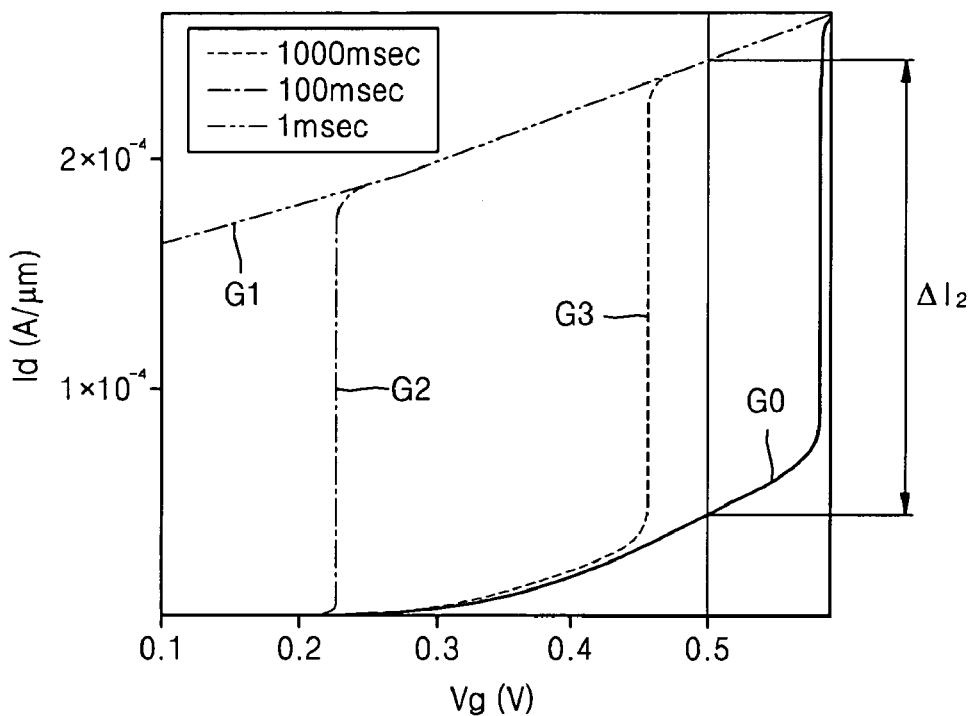

FIGS. 4 and 5 are graphs showing a change, according to time, in drain current (Id) with respect to gate voltage (Vg) properties of a conventional capacitorless DRAM, which is described with reference to FIG. 1A, and a capacitorless DRAM according to example embodiments, which is described with reference to FIG. 2, respectively. For example, FIG. 4 shows changes, according to time, in drain current (Id)-gate voltage (Vg) properties, after holes are accumulated in the channel body 30c of FIG. 1a. FIG. 5 shows changes, according to time, in drain current (Id)-gate voltage (Vg) properties, after holes are accumulated in the hole reservoir 75 of FIG. 2.

In FIGS. 4 and 5, reference numerals G1, G2 and G3 are graphs of Id with respect to Vg, measured at a time when about 1 msec, about 100 msec, and about 1000 msec, respectively have commenced, after holes are accumulated. Reference numeral G0 is a graph of Id with respect to Vg, measured before holes are accumulated. Referring to FIG. 4, the graphs G3 and G0 exhibit almost the same results. In the conventional capacitorless DRAM of FIG. 1A, about 1 second after holes have been accumulated in the floating channel body 30c, most of the holes accumulated in the floating channel body 30c may be lost. As may be seen from FIG. 4, a difference between G1 and G0 may be about $2 \times 10^{-5}$ (A/μm) at about 0.5 V, which is an interest gate voltage, and a difference ($\Delta I_1$) between G3 and G0 may be about $0.2 \times 10^{-5}$ (A/μm) at about 0.5 V.

Referring to FIG. 5, a difference ($\Delta I_2$) between G3 and G0 at an interest gate voltage of about 0.5 V may be the same as a difference between G1 and G0 at about 0.5 V. The holes, which are initially reserved in the hole reservoir 75, may not be lost, but may be retained therein for a relatively long period of time. From the result of FIG. 5, the difference ($\Delta I_2$) between G3 and G0 at an interest gate voltage of about 0.5 V, which is about $2 \times 10^{-4}$ (A/μm), may be larger than the $\Delta I_1$ of FIG. 4. The sensing margin of the capacitorless DRAM of example embodiments may be larger than that of the conventional capacitorless DRAM.

From the results of FIGS. 4 and 5, data retention properties of the capacitorless DRAM according to example embodiments of FIG. 2 may be improved compared with those of the conventional capacitorless DRAM of FIG. 1A. The structure of the capacitorless DRAM according to the example embodiment of FIG. 2 may be variously changed as illustrated in FIGS. 6 and 7.

Figure 6:
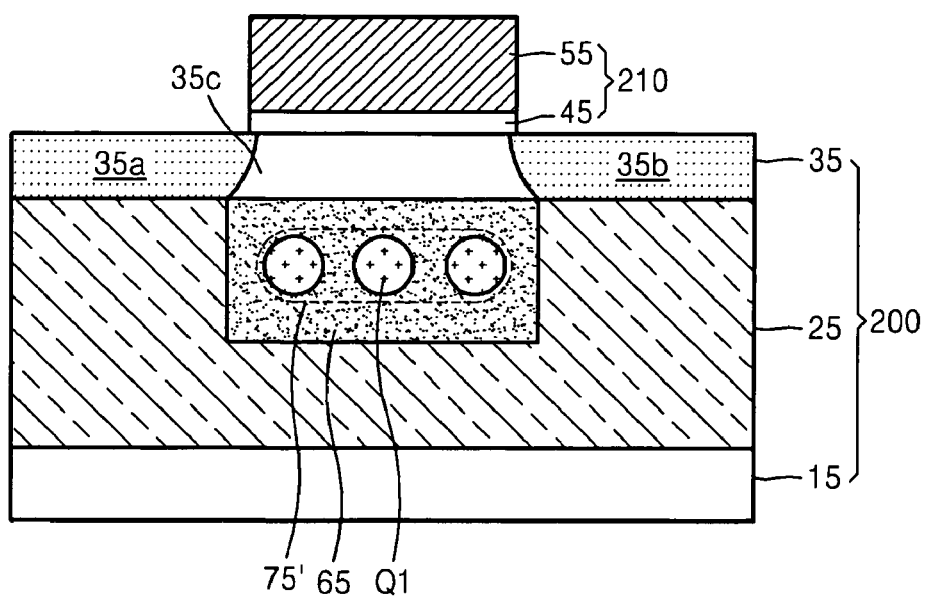
Figure 7:
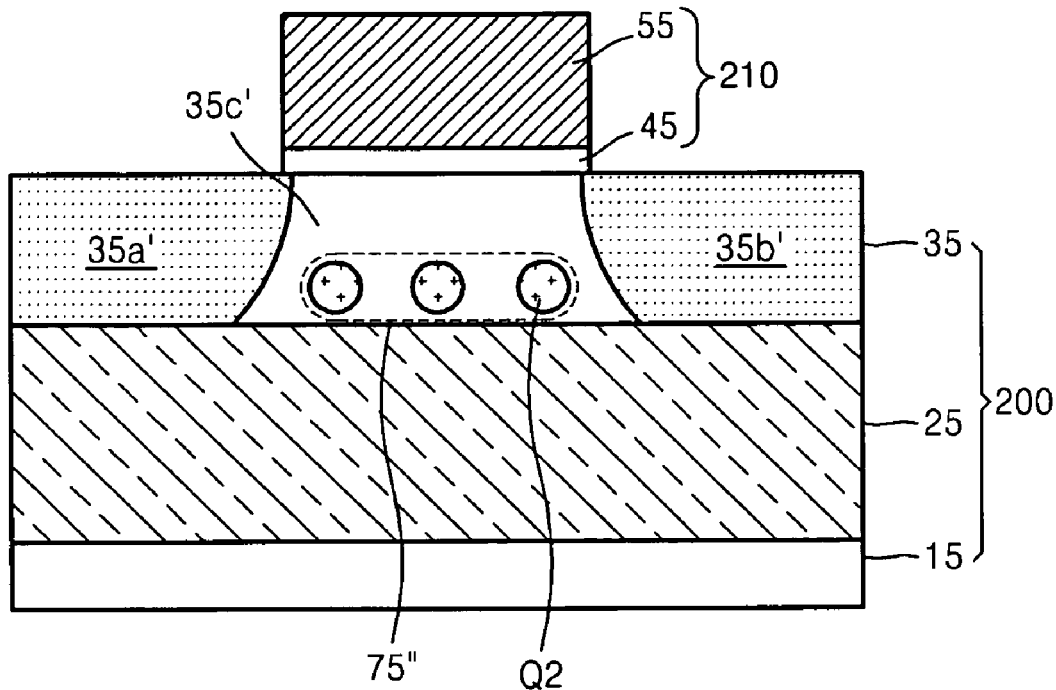

FIGS. 6 and 7 are cross-sectional views of a capacitorless DRAM according to example embodiments. Referring to FIG. 6, the hole reservoir 75' may include quantum dots Q1. In FIG. 6, the rest of other elements except the hole reservoir 75' are all the same as those illustrated in FIG. 2.

Referring to FIG. 7, the hole reservoir 75" including the quantum dots Q1 may be formed in a lower portion of the channel body 35c', and the third silicon layer 65 of FIG. 2 may not exist. The channel body 35c', the source 35a', and the drain 35b' of FIG. 7 may be thicker than the channel body 35c, the source 35a, and the drain 35b of FIG. 2. For example, the channel body 35c' of FIG. 7 may be a partially depleted region having a thickness of about 150 nm. Although the first silicon layer 15 is illustrated in FIGS. 2, 6 and 7, the capacitorless DRAMs according to example embodiments may not include the first silicon layer 15.

Figure 8A:
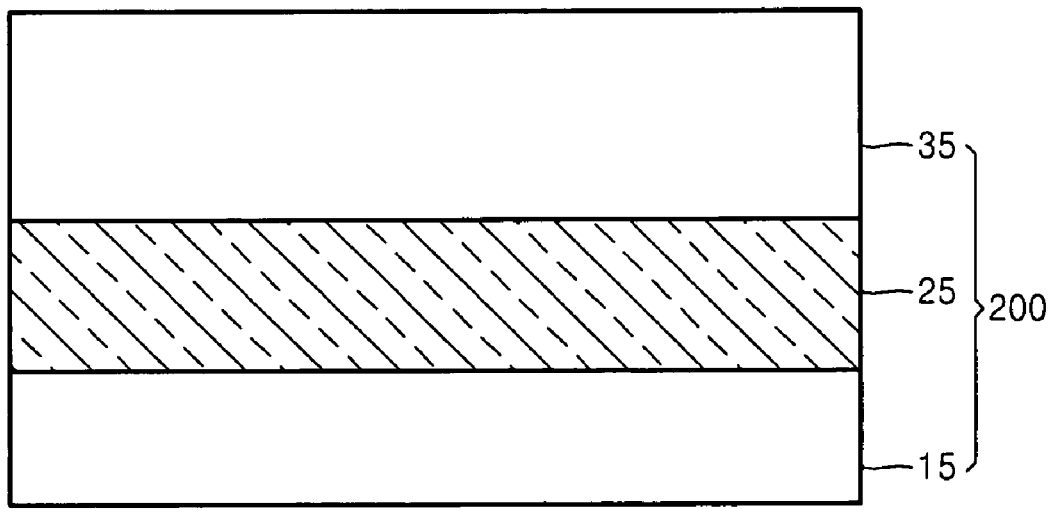

Hereinafter, a method of manufacturing a capacitorless DRAM according to example embodiments will be described. FIGS. 8A-8G are cross-sectional views showing a method of manufacturing a capacitorless DRAM according to example embodiments. Referring to FIG. 8A, a SOI substrate 200, having a structure in which a first silicon layer 15, an oxide layer 25, and a second silicon layer 35 are sequentially formed, may be prepared.

Figure 8B:
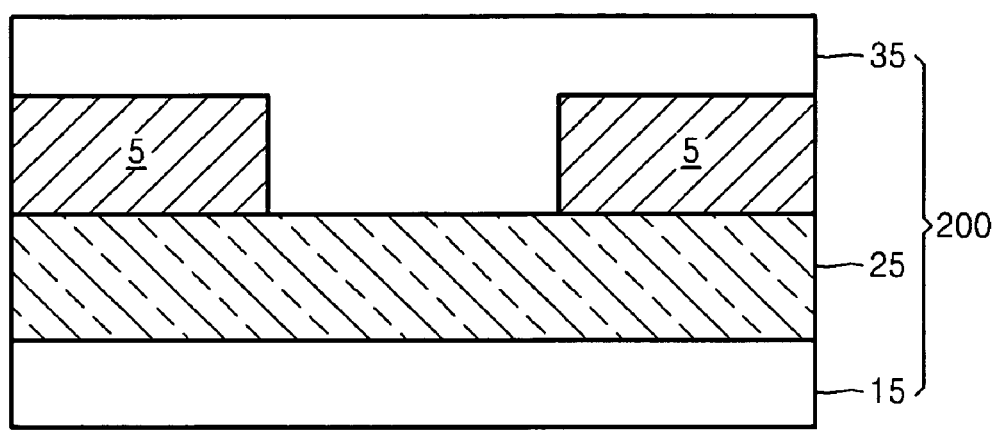
Figure 8C:
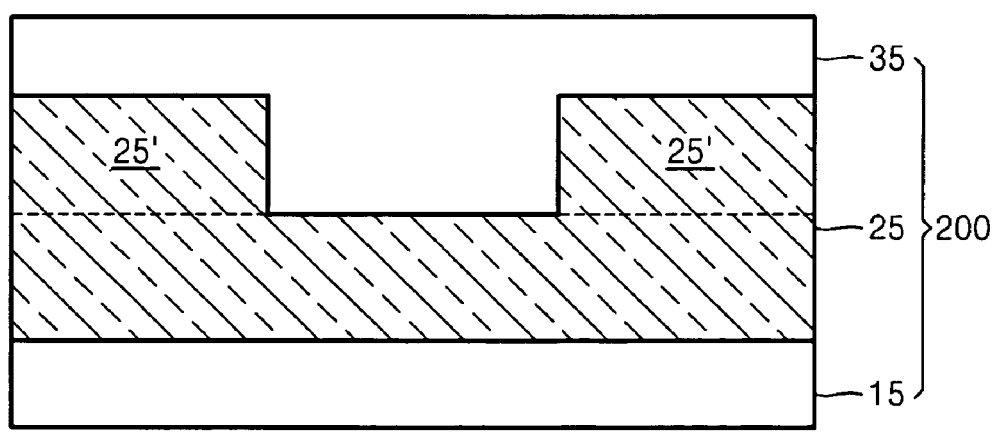

Referring to FIG. 8B, first parts 5 may be formed in a lower portion of the second silicon layer 35, separated from each other, and doped with oxygen. The first parts 5 may be formed to contact the oxide layer 25. After the first parts 5 are formed, the first parts 5 may be heat-treated at a predetermined or given temperature to be oxidized. The resultant state of the first parts 5 being oxidized is illustrated in FIG. 8C. In FIG. 8C, reference numeral 25' denotes the oxidized first parts. The oxidized first parts 25' may be the same as the oxide layer 25.

Figure 8D:
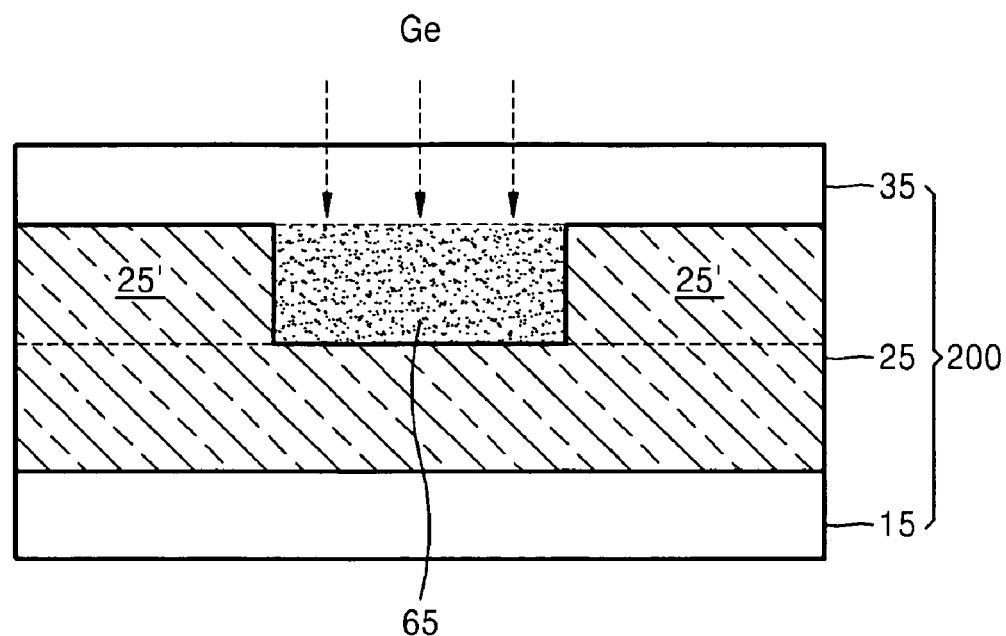

Referring to FIG. 8D, an impurity region 65 may be formed in the portion of the second silicon layer 35 that is between the oxidized first parts 25'. The impurity region 65 may be a p+ impurity region formed by ion implanting a p-type impurity. The ion implanting of the p-type impurity may be an optional process. The time when the p-type impurity is ion implanted may vary. For example, in the operation of FIG. 8A, the p-type impurity may be ion implanted into a part of the second silicon layer 35 or all of the second silicon layer 35.

Figure 8E:
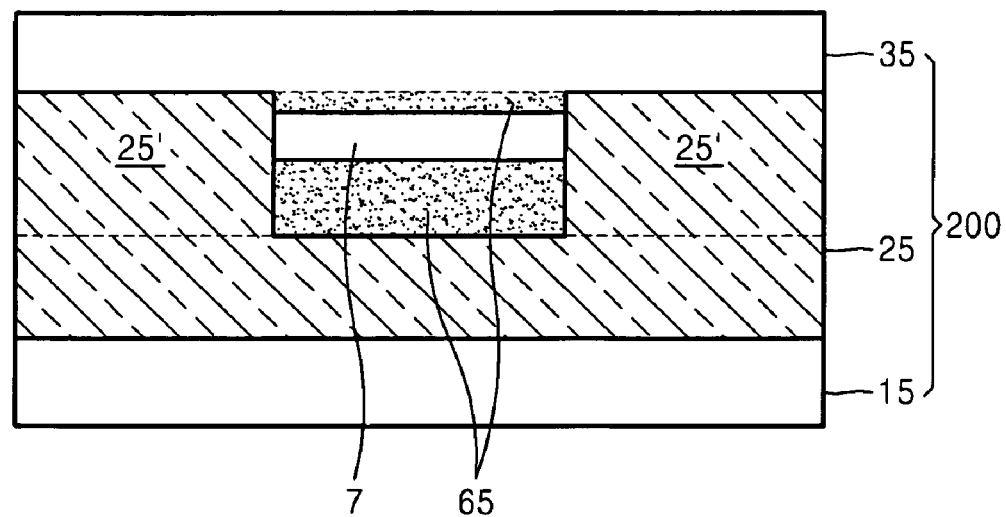

Subsequently, a predetermined or given impurity, for example, Ge, may be ion implanted into the impurity region 65. As a result, a second part 7 doped with Ge may be formed in the impurity region 65 as illustrated in FIG. 8E. The second part 7 may be formed in the impurity region 65 such that the impurity region 65 is divided into upper and lower portions. The depth of the second part 7 may be adjusted by conditions of the ion implantation. The impurity region 65 existing on an upper surface of the second part 7 may be thinner than the impurity region 65 existing on a lower surface of the second part 7.

Figure 8F:
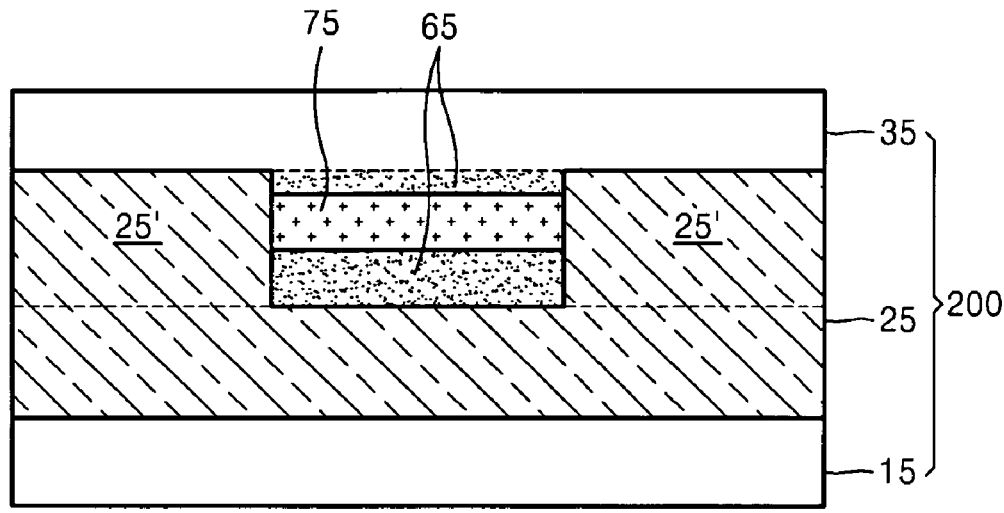

The second part 7 may be annealed to segregate the doped Ge. As a result, a hole reservoir 75 formed of Si—Ge may be formed as illustrated in FIG. 8F. The hole reservoir 75 may be buried in the second silicon layer 35, for example, in the impurity region 65. The valence band of the hole reservoir 75 may be higher than the valence bands of the impurity region 65, and the first and second silicon layers 15 and 35.

Figure 8G:
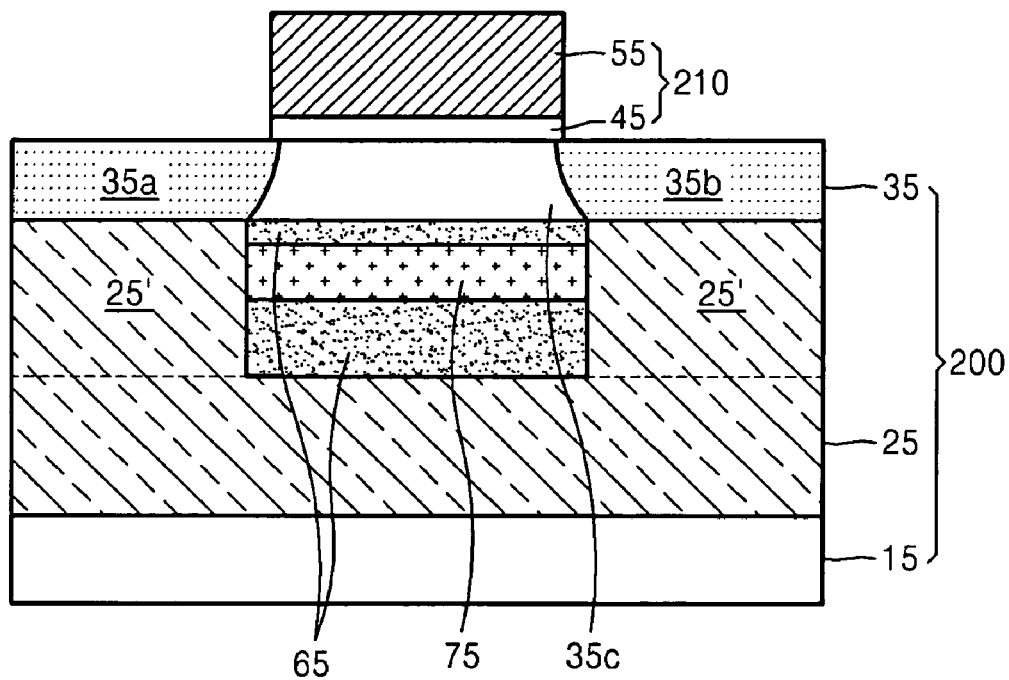

Referring to FIG. 8G, a gate 210 may be formed on a region of the second silicon layer 35, wherein the region corresponds to the hole reservoir 75. The gate 210 may have a structure in which a gate insulating layer 45 and a gate conductive layer 55 are sequentially formed. A source 35a and a drain 35b may be formed in the second silicon layer 35 on either side of the gate 210.

Figure 9A:
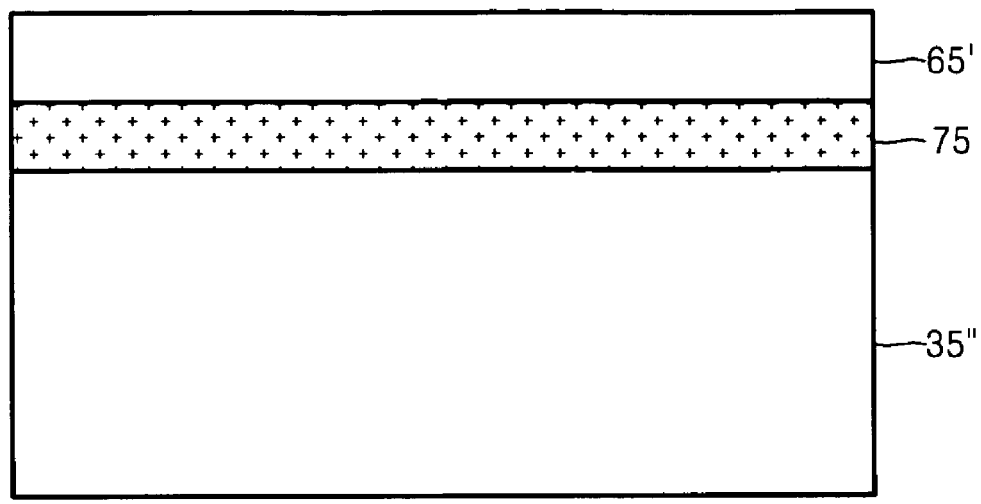

FIGS. 9A-9G are cross-sectional views showing a method of manufacturing a capacitorless DRAM according to example embodiments. The elements of FIGS. 9A-9G that are the same as those of FIGS. 8A-8G have the same reference numerals. Referring to FIG. 9A, the hole reservoir 75 and a silicon layer 65' may be sequentially formed on a silicon substrate 35". The valence band of the hole reservoir 75 may be higher than the valence band of the silicon substrate 35" and the silicon layer 65'. The silicon substrate 35", the hole reservoir 75, and the silicon layer 65' respectively correspond to a first semiconductor layer, a hole reservoir, and a second semiconductor layer.

The structure of FIG. 9A may be formed using other methods. For example, the hole reservoir 75 may be formed to be buried by ion implanting an impurity, e.g., Ge, into the silicon substrate 35" and annealing, instead of forming the hole reservoir 75 and the silicon layer 65' on the silicon substrate 35". Herein, the silicon substrate 35" may be divided by the hole reservoir 75 into upper and lower portions, and thus the upper portion of the silicon substrate 35" divided by the hole reservoir 75 may act as a silicon layer 65'.

Figure 9B:
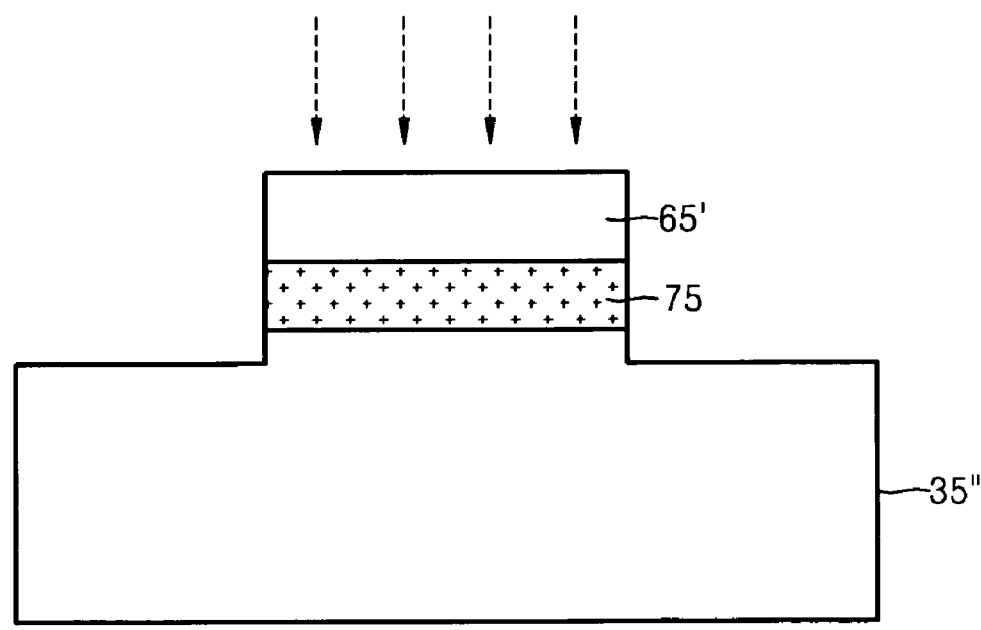
Figure 9C:
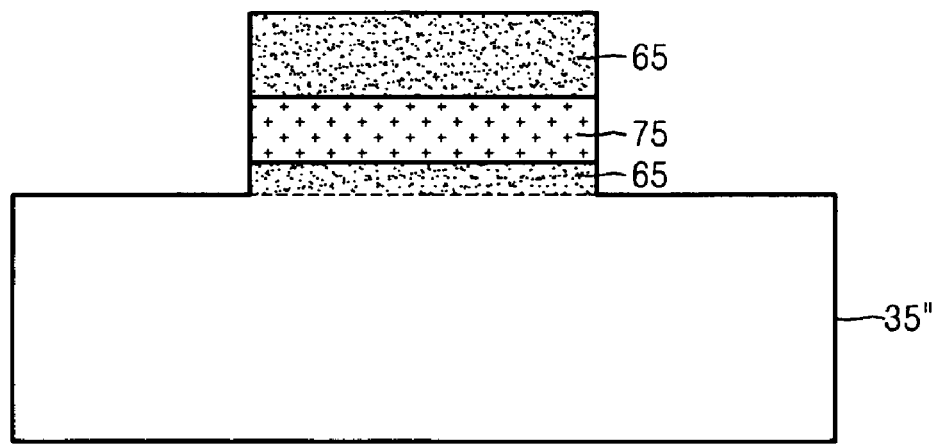

Referring to FIG. 9B, a mask layer (not shown) for forming a gate may be formed on the silicon layer 65'. Then, the silicon layer 65' and the hole reservoir 75 around the mask layer may be etched, and the silicon substrate 35" may be etched to a predetermined or given thickness. Subsequently, the mask layer may be removed. A p-type impurity may be ion implanted into the silicon layer 65' and into a predetermined or given region of the silicon substrate 35" which is on a lower surface of the hole reservoir 75 and may protrude upwards due to the etching process. As a result, impurity regions 65 may be formed on upper and lower surfaces of the hole reservoir 75 as illustrated in FIG. 9C. Herein, the p-type impurity may also be ion implanted into the hole reservoir 75. The ion implantation of the p-type impurity may be optional.

Figure 9D:
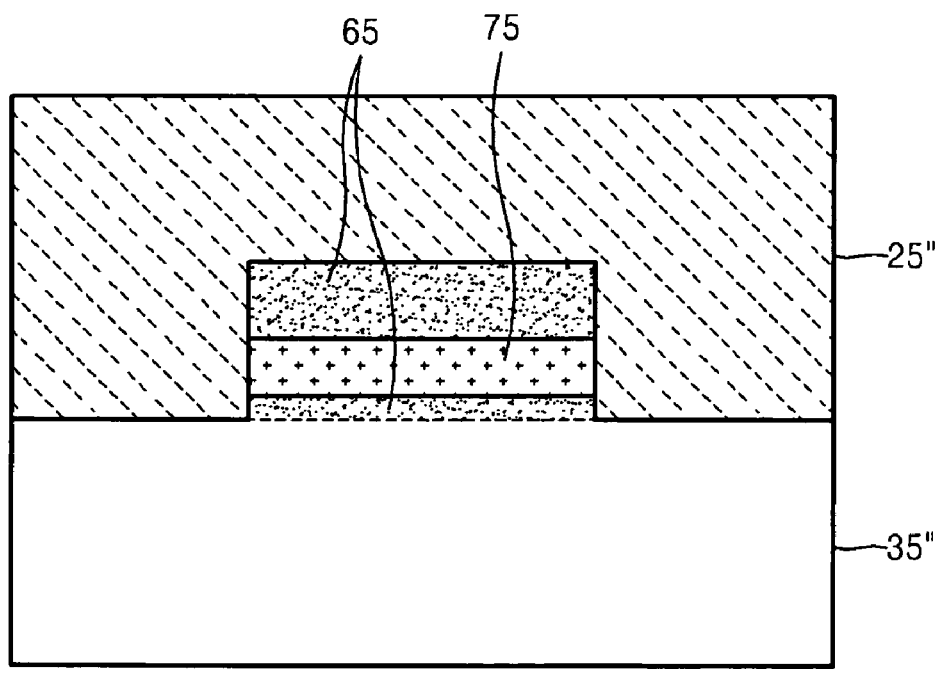
Figure 9E:
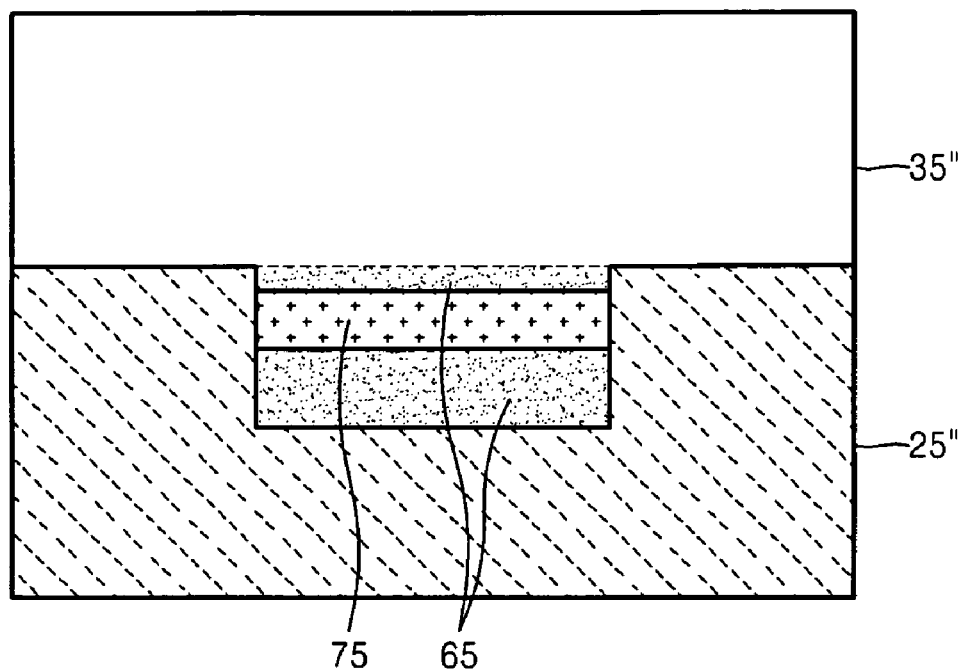

Referring to FIG. 9D, an oxide layer 25" may be formed on the etched silicon substrate 35" to cover the hole reservoir 75 and the impurity regions 65. Subsequently, the laminating structure including the oxide layer 25", the impurity regions 65, the hole reservoir 75, and the silicon substrate 35" may be made upside down. FIG. 9E shows the upside-down laminating structure material.

Figure 9F:
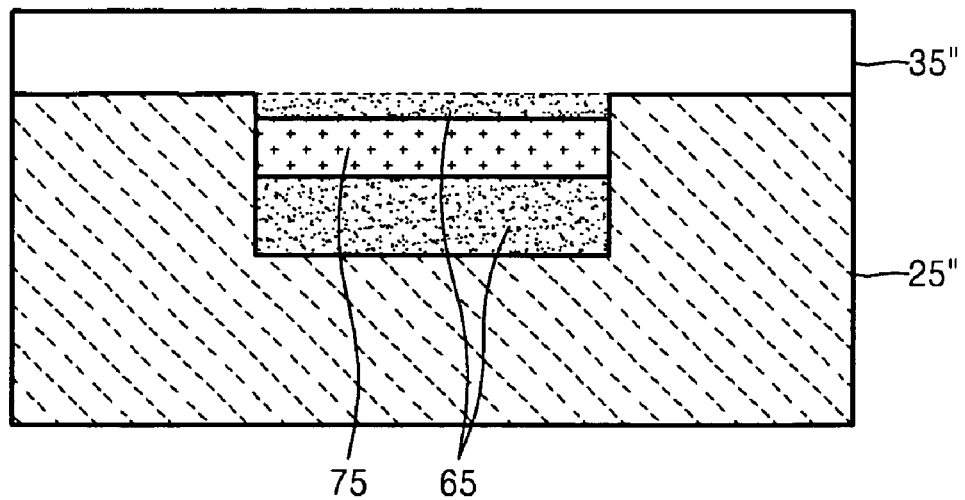
Figure 9G:
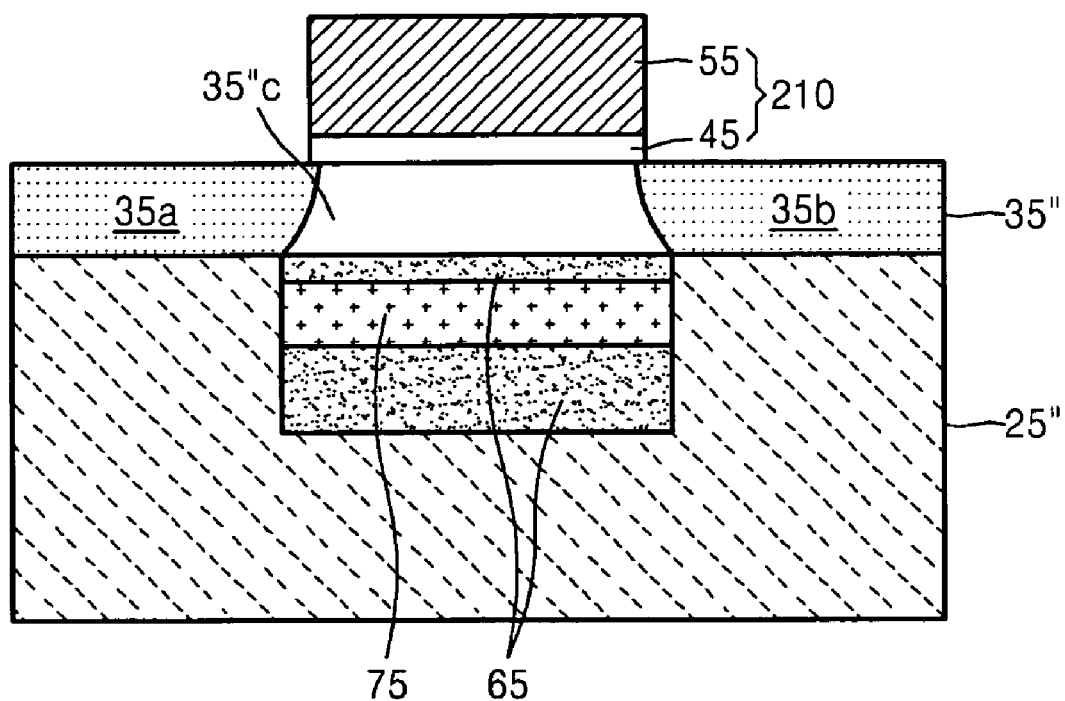

Referring to FIG. 9F, the upper surface of the silicon substrate 35" may be polished. The polishing may be performed until the silicon substrate 35'' has a desired thickness. The polishing may be performed using, for example, chemical mechanical polishing (CMP). Referring to FIG. 9G, a gate 210 may be formed on a region of the silicon substrate 35'', wherein the region corresponds to the hole reservoir 75. The gate 210 may have a structure in which a gate insulating layer 45 and a gate conductive layer 55 are sequentially formed. A source 35a and a drain 35b may be formed in the silicon substrate 35'' on either side of the gate 210.

Figure 10A:
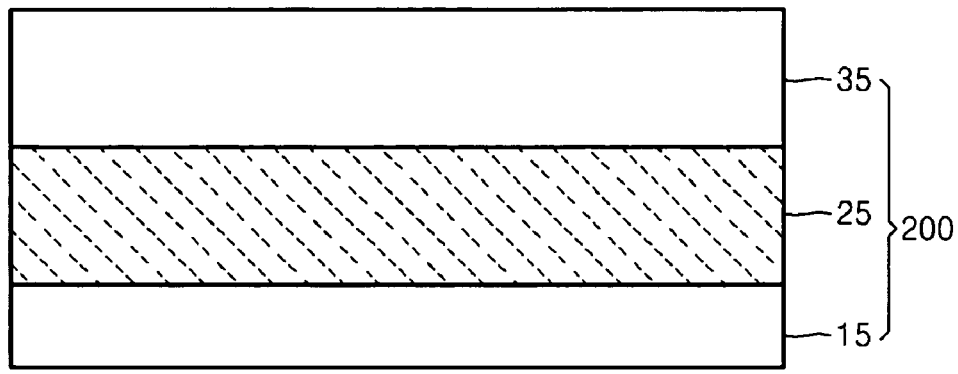
Figure 10B:
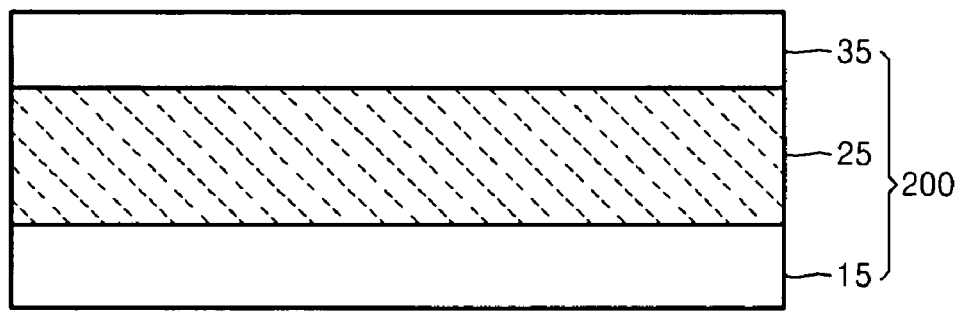

FIGS. 10A-10G are cross-sectional views showing a method of manufacturing a capacitorless DRAM according to example embodiments. Referring to FIG. 10A, a SOI substrate 200, having a structure in which a first silicon layer 15, an oxide layer 25, and a second silicon layer 35 are sequentially formed, may be prepared. Referring to FIG. 10B, the second silicon layer 35 may be polished to reduce its thickness. The polishing may be performed using, for example, CMP.

Figure 10C:
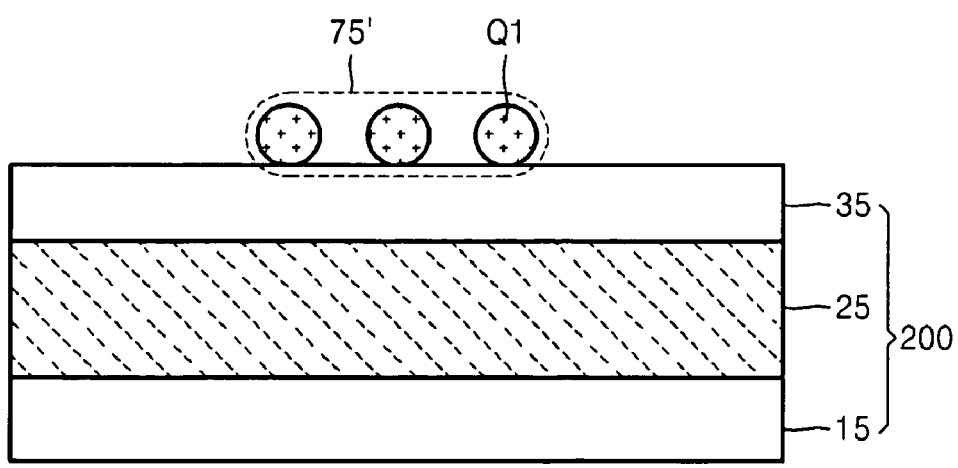
Figure 10D:
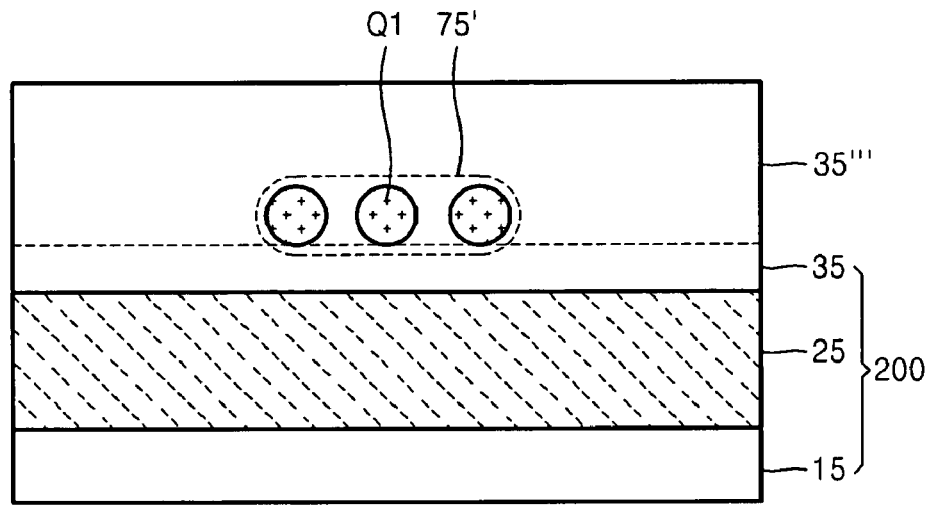

Referring to FIG. 10C, a hole reservoir 75' including quantum dots Q1s may be formed on a portion of the surface of the polished second silicon layer 35. The hole reservoir 75' may be formed by various methods. For example, a mixture, in which the hole reservoir 75' including quantum dots Q1s and a predetermined or given solvent are mixed, may be coated entirely on the second silicon layer 35, and then the solvent may be volatilized, and a part of the hole reservoir 75' may be removed. In addition to the coating method, the hole reservoir 75' may be formed by a nano fabrication process, e.g., agglomeration and/or selective etching. The hole reservoir 75' may include a semiconductor material, e.g., Ge, Si—Ge, Al—Sb and/or Ga—Sb, and may include a metal material. The semiconductor material and the metal material may be any material which has a higher valence band than the first and second silicon layers 15 and 35. Referring to FIG. 10D, a semiconductor layer 35''' may be formed on the second silicon layer 35 to cover the hole reservoir 75'. The semiconductor layer 35''' may be a silicon layer.

Figure 10E:
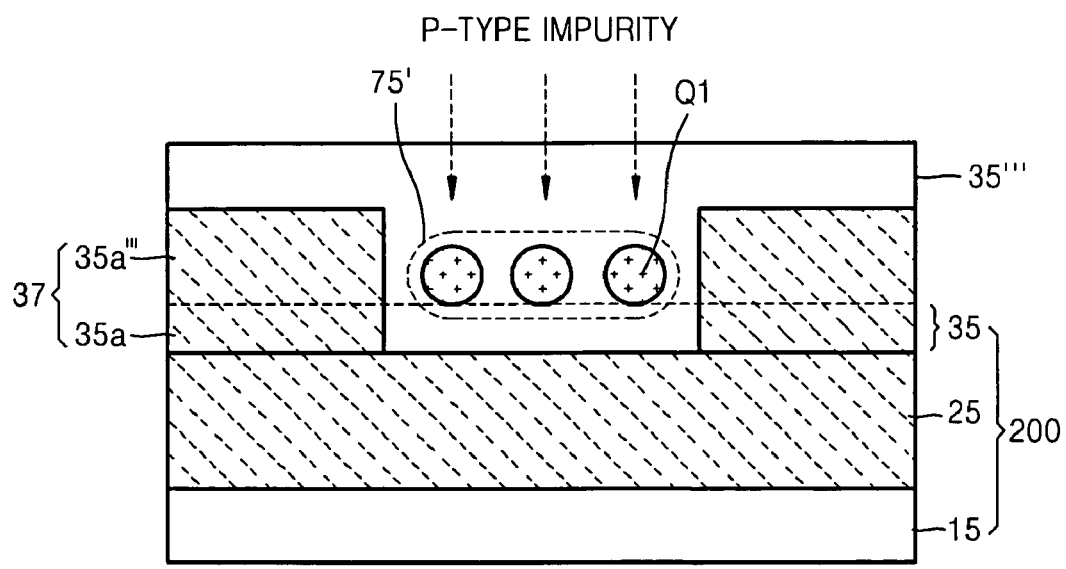

Referring to FIG. 10E, first oxide regions 35a may be formed in the second silicon layer 35 on both sides of the hole reservoir 75'. Second oxide regions 35a'', which contact the first oxide regions 35a, may be formed in a lower portion of the semiconductor layer 35''' on both sides of the hole reservoir 75'. The first and second oxide regions 35a and 35a''' may be the same oxide region. Oxide regions 37 including the first and second oxide regions 35a and 35a''' correspond to the oxidized first parts 25' of FIG. 8C, and thus may be formed by the same method as the method of forming the first parts 25'. A process of forming the oxide regions 37 may be optional. If the oxide region 37 is not formed, the capacitorless DRAM of FIG. 7 may be obtained. A region where the oxide regions 37 are formed may vary. For example, a part of or all of a lower portion of the second silicon layer 35 may be oxidized, and the semiconductor layer 35''' may not be oxidized.

Figure 10F:
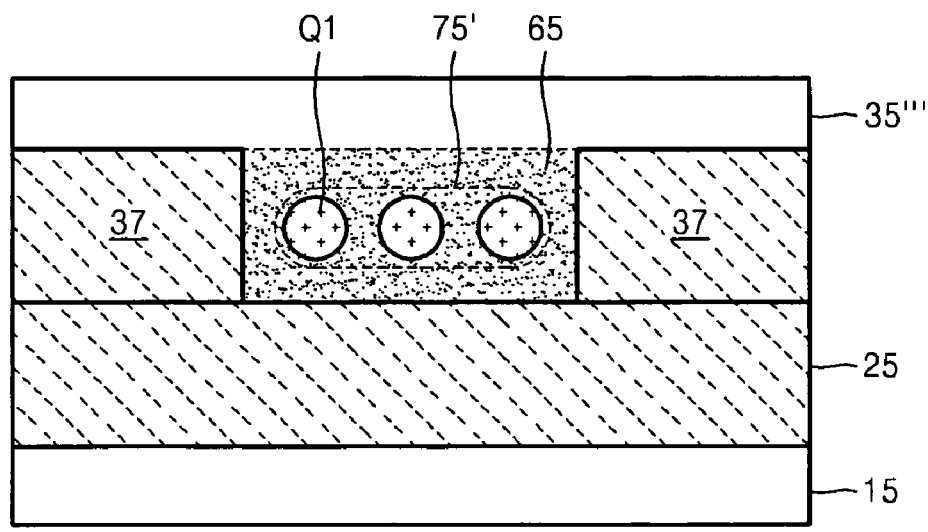

A p-type impurity may be ion implanted into the second silicon layer 35 and the semiconductor layer 35''' which are formed between the oxide regions 37. As a result, the second silicon layer 35 and the semiconductor layer 35''', which are formed between the oxide regions 37, may become an impurity region 65 including the hole reservoir 75' as illustrated in FIG. 10F. The ion implantation of the p-type impurity may be optional. The point in the method of manufacturing a capacitorless DRAM when ions are implanted may vary. For example, in the operation of FIG. 10D, after the semiconductor layer 35''' is formed, the p-type impurity may be ion implanted into a part of or all of the region of the second silicon layer 35 and the semiconductor layer 35'''.

Figure 10G:
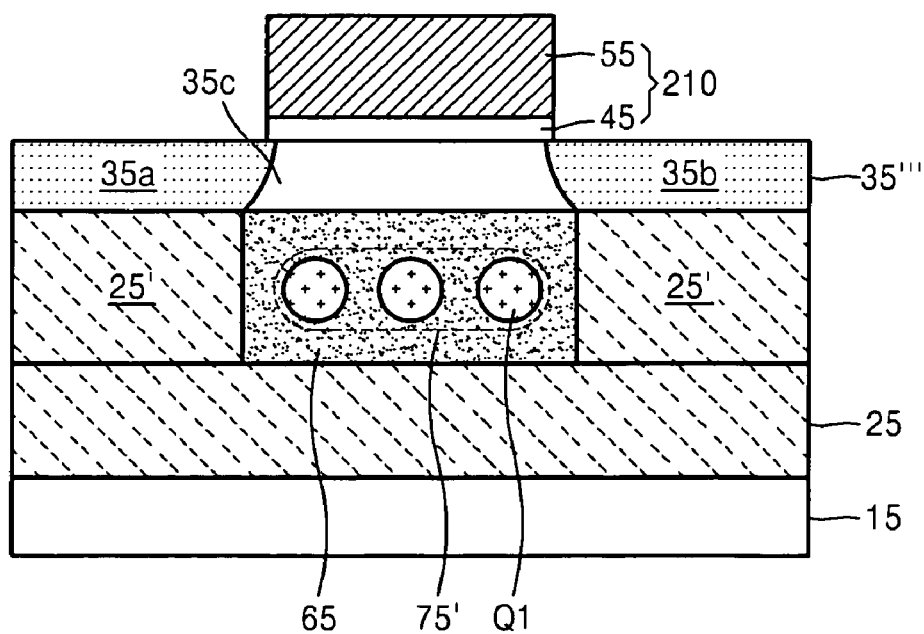

Referring to FIG. 10G, a gate 210 may be formed on a region of the semiconductor layer 35''', wherein the region corresponds to the hole reservoir 75'. The gate 210 may have a structure in which a gate insulating layer 45 and a gate conductive layer 55 are sequentially formed. A source 35a and a drain 35b may be formed in the semiconductor layer 35''' on either side of the gate 210.

As described above, the capacitorless DRAM according to example embodiments may include the hole reservoir formed below the channel region, wherein the hole reservoir is separated from the source and the drain, and may more easily reserve holes. Thus, the capacitorless DRAM according to example embodiments may have improved data retention properties.

For example, when the capacitorless DRAM of example embodiments is used, an increase in junction leakage current may be prevented or reduced although the length of channels is reduced. Therefore, the integration of the capacitorless DRAM may be increased. The capacitorless DRAM of example embodiments may have a single gate structure in which one transistor has one gate, and thus operates with less power consumption compared to a conventional capacitorless DRAM having a dual gate structure.

While example embodiments have been particularly shown and described with reference to embodiments thereof, it should not be construed as being limited to the embodiments set forth herein. It will be obvious to those of ordinary skill in this art that, for example, the kind, material and structure of the substrate and the hole reservoir may be changed, and the structure of the capacitorless DRAMs according to example embodiments may also be variously changed. Therefore, the scope of example embodiments is defined not by the detailed description of example embodiments but by the appended claims.

What is claimed is:

1. A capacitorless DRAM, comprising:
   a substrate including an insulating layer, a first semiconductor layer over the insulating layer, and a source, a drain and a channel within the first semiconductor layer;
   a gate on the channel of the substrate; and
   a hole reserving unit disposed below the first semiconductor layer and under the channel, the hole reserving unit including an upper layer, a lower layer and a hole reservoir between the upper layer and the lower layer,
   wherein sidewalls and a lower surface of the upper layer, the lower layer and the hole reservoir are surrounded by the insulating layer.

2. The capacitorless DRAM of claim 1, wherein the hole reserving unit includes a second semiconductor layer, the hole reservoir existing in the second semiconductor layer.

3. The capacitorless DRAM of claim 2, wherein the second semiconductor layer is a p-type semiconductor layer.

4. The capacitorless DRAM of claim 2, wherein a valence band of the hole reservoir is higher than a valence band of the first semiconductor layer.

5. The capacitorless DRAM of claim 4, wherein the hole reservoir includes at least one of a semiconductor material and a metal material.

6. The capacitorless DRAM of claim 5, wherein the first semiconductor layer is a Si layer, and the semiconductor material includes at least one of Ge, Si—Ge, Al—Sb and Ga—Sb.

7. The capacitorless DRAM of claim 2, wherein a valence band of the hole reservoir is higher than a valence band of the second semiconductor layer.

8. The capacitorless DRAM of claim 7, wherein the hole reservoir includes at least one of a semiconductor material and a metal material.

9. The capacitorless DRAM of claim 8, wherein the first semiconductor layer is a Si layer, and the semiconductor material includes at least one of Ge, Si—Ge, Al—Sb and Ga—Sb.

10. The capacitorless DRAM of claim 2, wherein the hole reservoir is separated from the source and the drain.

11. The capacitorless DRAM of claim 2, wherein the hole reservoir is formed to be a layer.

12. The capacitorless DRAM of claim 2, wherein the hole reservoir includes quantum dots.

13. The capacitorless DRAM of claim 1, wherein a valence band of the hole reservoir is higher than a valence band of the first semiconductor layer.

14. The capacitorless DRAM of claim 13, wherein the hole reservoir includes at least one of a semiconductor material and a metal material.

15. The capacitorless DRAM of claim 14, wherein the first semiconductor layer is a Si layer, and the semiconductor material includes at least one of Ge, Si—Ge, Al—Sb and Ga—Sb.

16. The capacitorless DRAM of claim 1, wherein a region between the source and the drain of the first semiconductor layer is a fully depleted region or a partially depleted region.

17. The capacitorless DRAM of claim 1, wherein the hole reservoir is formed to be a layer.

18. The capacitorless DRAM of claim 1, wherein the hole reservoir includes quantum dots.

19. The capacitorless DRAM of claim 1, wherein the substrate is a silicon on insulator (SOI) substrate.

20. The capacitorless DRAM of claim 1, wherein the hole reserving unit includes a semiconductor layer, the hole reservoir being formed in the semiconductor layer.

21. The capacitorless DRAM of claim 20, wherein the hole reservoir is formed to be a layer.

22. The capacitorless DRAM of claim 20, wherein the hole reservoir includes quantum dots.

* * * * *